United States Patent
Lin et al.

(10) Patent No.: US 7,128,821 B2
(45) Date of Patent: Oct. 31, 2006

(54) ELECTROPOLISHING METHOD FOR REMOVING PARTICLES FROM WAFER SURFACE

(75) Inventors: Shih-Ho Lin, Jhubei (TW); Chung-Chang Chen, Hsin-chu (TW); Kei-Wei Chen, Taipei (TW); Shih-Tzung Chang, Taichung (TW); Chao-Lung Chen, Hsin-Chu (TW); Po-Jen Shih, Tainan (TW); Yu-Ku Lin, Hsin-Chu (TW); Ying-Lang Wang, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 95 days.

(21) Appl. No.: 10/761,477

(22) Filed: Jan. 20, 2004

(65) Prior Publication Data

US 2005/0155869 A1 Jul. 21, 2005

(51) Int. Cl.
*C25D 5/34* (2006.01)
*C25F 1/00* (2006.01)

(52) U.S. Cl. .................. 205/215; 205/219; 205/660; 205/684

(58) Field of Classification Search ............. 205/215, 205/219, 660, 684
See application file for complete search history.

(56) References Cited

U.S. PATENT DOCUMENTS

| | | | | |
|---|---|---|---|---|
| 5,807,165 | A | * | 9/1998 | Uzoh et al. ............... 451/41 |
| 6,017,437 | A | * | 1/2000 | Ting et al. ............... 205/80 |
| 6,258,710 | B1 | * | 7/2001 | Rathore et al. ........... 438/628 |
| 6,492,262 | B1 | * | 12/2002 | Uzoh ....................... 438/637 |
| 6,689,686 | B1 | * | 2/2004 | Guldi et al. .............. 438/678 |
| 2002/0000382 | A1 | * | 1/2002 | Morrissey et al. ......... 205/115 |
| 2002/0056645 | A1 | * | 5/2002 | Taylor et al. ............. 205/103 |
| 2003/0201185 | A1 | * | 10/2003 | Bajaj et al. .............. 205/104 |
| 2003/0209448 | A1 | * | 11/2003 | Hu et al. .................. 205/640 |

FOREIGN PATENT DOCUMENTS

SU 1440636 * 11/1988
TW 221315 B1 * 9/2004

* cited by examiner

*Primary Examiner*—Roy King
*Assistant Examiner*—Michael P. Alexander
(74) *Attorney, Agent, or Firm*—Tung & Associates

(57) ABSTRACT

An electropolishing method for removing potential device-contaminating particles from a wafer, is disclosed. The method includes immersing the wafer in an electropolishing electrolyte solution and removing defects and particles from the wafer by rotational friction between the wafer and the electrolyte solution in combination with electrolysis. The method is effective in removing particles from via openings of all sizes, including via openings having a width smaller than about 0.2 μm.

19 Claims, 2 Drawing Sheets

ELECTROPOLISHING METHOD FOR REMOVING PARTICLES FROM WAFER SURFACE

FIELD OF THE INVENTION

The present invention relates to methods for removing particulate contaminants from the surfaces of semiconductor wafer substrates during the fabrication of integrated circuits on the substrates. More particularly, the present invention relates to a novel electropolishing method which is suitable for the removal of metal particles and defects from a seed layer in trench and via openings on a wafer prior to the electroplating of metal trench and via interconnects on the wafer.

BACKGROUND OF THE INVENTION

In the fabrication process for semiconductor devices, numerous fabrication steps, as many as several hundred, must be executed on a silicon wafer in order to complete integrated circuits on the wafer. Generally, the process for manufacturing integrated circuits on a silicon wafer substrate typically involves deposition of a thin dielectric or conductive film on the wafer using oxidation or any of a variety of chemical vapor deposition processes; formation of a circuit pattern on a layer of photoresist material by photolithography; placing a photoresist mask layer corresponding to the circuit pattern on the wafer; etching of the circuit pattern in the conductive layer on the wafer; and stripping of the photoresist mask layer from the wafer.

Prior to deposition of the conductive and insulative layers on a wafer, the wafer is typically subjected to a polishing operation to provide an extremely level starting surface on the wafer. During the subsequent structuring of the substrate, the various processing steps are used to build up the layers of conductors and dielectrics, for example, on which other layers are formed to fabricate the circuits. With structuring becoming ever finer, the associated replication processes are becoming more sensitive to surface variations on the substrate. Therefore, it has now become necessary to "re-level" the wafer surface even while production of the integrated circuits are in progress. The re-leveling operation is referred to as planarizing and is typically accomplished using the CMP (chemical mechanical planarization) method using a chemical mechanical polishing process.

In chemical mechanical polishing, an abrasive suspension agent or slurry is dispensed onto a polishing surface. Relative movement between the polishing surface and the wafer produces a combined mechanical and chemical effect on the surface of the wafer. This process creates a highly level surface on the wafer. In order to remove the still-moist remains of slurry, as well as small surface defects which may remain in the wafer and disrupt the otherwise planar continuity of the wafer surface after the CMP process, post-CMP cleaning steps are required.

One of the cleaning steps carried out after the chemical mechanical polishing process is facilitated using rotating scrubber brushes which are actuated inside a scrubber cleaner. Accordingly, a special washing fluid and a rotational movement with multiple pairs of scrubber brushes can clean both sides of the wafer using contact pressure against the wafer. Because the wafer becomes considerably more valuable with each successive planarizing operation, the post-CMP brush cleaning operation is commercially significant.

One of the most common post-CMP scrubber cleaners used to remove residues from a wafer substrate after a CMP operation is the Dai Nippon Screen (DNS) brush scrubber cleaner. The DNS brush scrubber cleaner cleans wafers using a combination of rinsing, megasonic rinsing, and brush cleaning. The wafer substrates, having been previously subjected to chemical mechanical planarization, are loaded into a wet environment, typically water, and then transported through a series of cleaning chambers for the brush cleaning cycle. The brush cleaning cycle involves rotating the wafer at high speed, typically about 1500 rpm, while a jet of deionized water is sprayed on the wafer to dislodge any loose debris from the CMP process. Simultaneously, the wafer is brushed with a foam brush.

In addition to being used to clean wafers after a CMP process, the DNS scrubber cleaning method is used to remove metal particles from trenches and vias after a metal seed layer has been deposited in the trenches and vias typically using a dual damascene process. A typical dual damascene structure 10 is shown in FIG. 1 and includes a metal line 14 formed in a substrate 12. A bottom dielectric layer 16 is deposited on the substrate 12. A top dielectric layer 18 is deposited on the bottom dielectric layer 16. A via opening 20 is etched in the bottom dielectric layer 16, and a trench opening 22 is etched in the top dielectric layer 18, over the via opening 20.

A metal barrier layer 24 is deposited over the sidewalls of the trench opening 22 and over both the sidewalls and bottom of the via opening 20. A metal seed layer 26, typically copper, is deposited over the barrier layer 24. Finally, copper (not shown) is deposited in the via opening 20 and the trench opening 22, on the seed layer 26, using CVD (chemical vapor deposition) or metal electroplating techniques.

In the dual damascene process, particles 28 sometimes fall from the environment or from the seed layer 26, onto the bottom of the via opening 20 and/or trench opening 22. These particles 28 adversely affect the Rs and Rc performance of the metal interconnects formed in the via opening 20 and trench opening 22. Accordingly, the DNS scrubber cleaning method is frequently used to remove particulate contaminants from a via opening and/or a trench opening after formation of a seed layer in the opening and prior to electroplating the metal interconnects in the via opening and trench opening.

One of the limitations of the scrubber cleaning method to remove particulate contaminants from via openings in a damascene structure is that the method is ineffective in the removal of particles from via and trench openings having a width of less than about 0.2 μm. Consequently, the particles often remain in the openings upon subsequent electroplating of the metal interconnects, compromising the functional integrity of the interconnects in the finished IC device. Accordingly, a novel method is needed for the removal of particles from via openings and/or trench openings formed on a substrate, particularly via openings and trench openings having a width of less than about 0.2 μm.

An object of the present invention is to provide a novel method which is suitable for cleaning a substrate.

Another object of the present invention is to provide a novel method which is suitable for removing metal particles from via openings and/or trench openings in a substrate.

Still another object of the present invention is to provide a novel electropolishing cleaning method which is potentially capable of enhancing the Rc and Rs performance of IC devices fabricated on a semiconductor substrate.

Yet another object of the present invention is to provide an electropolishing cleaning method which utilizes a novel electrolyte solution to both remove defects from a seed layer deposited in trench and via openings and dissolve or remove potential device-contaminating particles remaining on the seed layer.

A still further object of the present invention is to provide a novel electropolishing cleaning method which is applicable to cleaning via and/or trench openings of various sizes on a wafer.

Yet another object of the present invention is to provide a novel electropolishing cleaning method which utilizes a combination of a rotational mechanical force and a series of electrical pulses or a continuous electrical pulse to remove defects from a seed layer in via and/or trench openings and dissolve or remove potential device-contaminating particles remaining on the seed layer.

SUMMARY OF THE INVENTION

In accordance with these and other objects and advantages, the present invention is generally directed to a new and improved electropolishing method for removing potential device-contaminating particles from a wafer. The method is particularly applicable to removing metal particles from via openings and/or trench openings formed in a dielectric layer on a wafer after the formation of a metal seed layer in the openings and prior to the electroplating of metal interconnects in the openings. The invention includes immersing the wafer in an electropolishing electrolyte solution and removing defects and particles from the seed layer by rotating the wafer in the solution. Simultaneously, a pulsing or continuous electrical current is applied to the wafer to remove metal from the seed layer by electrolysis. The method is effective in removing particles from via openings and trench openings of all sizes, including openings having a width smaller than about 0.2 μm.

Preferably, a pulsing electrical current, having a pulse current density of typically about 10 mA/Cm$^2$, is applied to the wafer by repeatedly reversing the polarity between the wafer and a metal electrode in the electrolyte solution. Accordingly, the wafer and the metal electrode alternate between being the cathode and the anode in the alternating pulsing phases. This causes repeated and alternating electroplating of metal from the electrolyte solution onto the seed layer and electrolytic etching of metal from the seed layer into the electrolyte solution. The net result is the removal of a thin layer of metal, as well as metal particles and defects, from the seed layer.

In application of the pulsing electrical current to the wafer, during the cathode phase (in which the wafer has a negative charge), metal cations from the electrolyte solution are reduced and electroplated onto the seed layer. During the anode phase (in which the wafer has a positive charge), metal is etched from the seed layer by electrolysis. The net effect of the electroplating and electrolytic phases, combined with friction imparted to the seed layer by rotation of the wafer in the electrolyte solution, results in a net loss of metal from the seed layer, on the order of typically less than about 200 angstroms. Consequently, potential device-contaminating metal particles remaining in the via and/or trench openings after seed layer deposition are removed from the openings and typically dissolved in or removed from the electrolyte solution.

In application of the continuous electrical current to the wafer, the wafer is the anode and the electrode is the cathode. Accordingly, metal is etched from the seed layer by electrolysis. This electrolytic effect, combined with friction imparted to the seed layer by rotation of the wafer in the electrolyte solution, results in a net loss of metal from the seed layer (typically less than about 200 angstroms). Potential device-contaminating metal particles remaining in the via openings and/or trench openings after deposition of the seed layer are therefore removed from the openings and dissolved in or removed from the electrolyte solution.

The electropolishing electrolyte solution is typically an acidic copper sulfate/sulfuric acid electrolyte solution having a pH of typically about 2.1. A surfactant may be present in the electrolyte solution in a concentration of typically about 14 ppm. Preferably, the surfactant is polyethylene glycol, a polyethylene glycol derivative, polypropylene glycol, or a polypropylene glycol derivative having a molecular weight of typically about 200~50,000. The surfactant modifies the ratio of the metal removal rate from the seed layer in the via opening and trench opening to achieve the purpose of removing contaminant particles from the via and/or trench opening.

BRIEF DESCRIPTION OF THE DRAWINGS

The invention will now be described, by way of example, with reference to the accompanying drawings, in which.

DETAILED DESCRIPTION OF THE INVENTION

Figure 1:
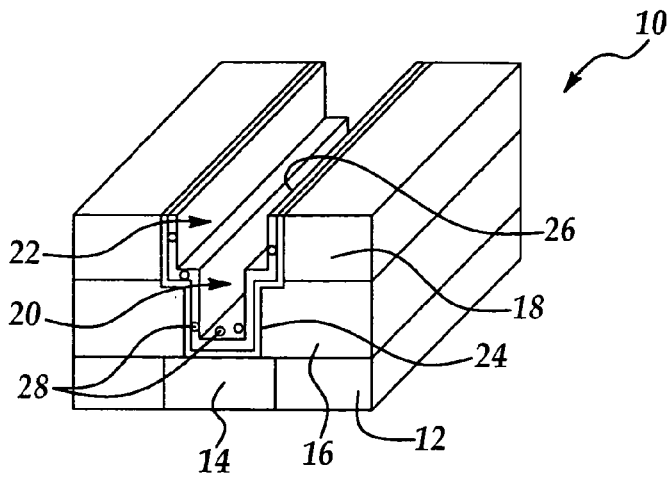
FIG. 1 is a perspective view of a trench opening and a via opening etched in dielectric layers on a wafer, with potential device-contaminating metal particles remaining in the bottom of the via opening as a result of seed layer deposition.

The present invention is particularly applicable to removing potential device-contaminating metal particles from a via opening and/or trench opening of a dual damascene structure, for example, after deposition of a seed layer in the via opening and trench opening. However, while references may be made herein to the removal of particles from via openings and trench openings, the present invention is not so limited in application but is equally applicable to the removal of potential device-contaminating metal particles from wafers in other stages or structures of semiconductor device fabrication.

The present invention contemplates a novel electropolishing method which is effective in the removal of potential device-contaminating particles, particularly metal particles, from a wafer. The method is particularly applicable to the removal of metal particles from via openings and/or trench openings formed in a dielectric layer on a wafer after the a metal seed layer is deposited on the sidewalls and bottom of the via and trench openings and prior to the electroplating of metal interconnects in the openings. The metal interconnects, substantially devoid of electrically-conductive metal particles, enhance Rc and Rs performance of IC devices fabricated on the wafer.

According to the invention, the wafer is immersed in an electropolishing electrolyte solution. Defects are removed from the seed layer and metal particles are removed from the via openings and/or trench openings on the wafer by rotation of the wafer in the solution during the simultaneous application of an electrical current to the wafer. The method is effective in removing particles from via and trench openings of all sizes, including openings having a width smaller than about 0.2 µm for 0.13 µm, 0.1 µm and beyond advanced process technology.

In a preferred embodiment, the electrical current applied to the wafer in the electrolyte solution is a pulsing electrical current. The pulsing electrical current is applied to the wafer in a continual and repeated reversing polarity which causes repeated and alternating electroplating of copper from the electrolyte solution onto the seed layer and electrolytic etching of copper from the seed layer into the electrolyte solution. The pulsing electrical current has a voltage of typically about 3 volts and a pulse current density of typically about 10 mA/Cm$^2$. The reversing polarity applied to the wafer is facilitated by alternating the electrical current between successive phases in which the wafer is alternatively the cathode and anode.

During the cathode phase of the pulsing electrical current, the wafer has a negative charge and metal cations from the electrolyte solution are reduced and electroplated onto the seed layer. Typically, about 10 angstroms of metal is deposited onto the seed layer during the electroplating cathode phase. During the anode phase, the wafer has a positive charge and metal is etched from the seed layer by electrolysis. Typically, about 20 angstroms of metal is removed from the seed layer during the electrolytic anode phase.

During application of the pulsing electrical current to the wafer, the wafer is rotated in the electrolyte solution, causing friction between the wafer and the solution. The wafer is rotated at a speed of typically about 30 rpm. The rotational motion of the wafer, combined with the electroplating and electrolytic phases imparted by the pulsing electrical current, results in a net loss of metal from the seed layer, on the order of typically less than about 200 angstroms. Potential device-contaminating metal particles which remained in the via and/or trench openings after deposition of the seed layer are removed from the openings and dissolve in or are removed from the electrolyte solution.

In a second embodiment of the method of the present invention, a continuous electrical current is applied to the wafer, in which case the wafer is the anode and the electrode is the cathode. Consequently, metal is removed from the seed layer by electrolysis. Simultaneously, the wafer is rotated in the electrolyte solution at a rotational speed of typically about 30 rpm. Accordingly, typically less than about 200 angstroms of the metal is removed from the seed layer. This facilitates the simultaneous removal of potential device-contaminating metal particles from the via and/or trench openings and removal of defects from the surface of the seed layer. The continuous electrical current applied to the wafer has a voltage of typically about 3 volts and a current density of typically about 10 mA/Cm$^2$.

In a preferred embodiment, the electropolishing electrolyte solution is an acidic copper sulfate/sulfuric acid aqueous electrolyte solution. The copper sulfate is present in the aqueous electrolyte solution as hydrous copper sulfate ($CuSO_4 \cdot 5H_2O$), in a concentration of typically about 48.5 g/L. The sulfuric acid ($H_2SO_4$) is present in the aqueous electrolyte solution in a concentration of typically about 22 g/L. Preferably, the electrolyte solution has an acidic pH of typically about 2.1. The electropolishing process is carried out with a solution temperature of typically about 14 degrees C.

A surfactant additive may be present in the electropolishing electrolyte solution to enhance the removal of metal particles from the wafer. In one embodiment, the surfactant additive is polyethylene glycol or a polyethylene glycol derivative. In another embodiment, the surfactant additive is polypropylene glycol or a polypropylene glycol derivative.

The surfactant additive has a molecular weight of from typically about 200 to typically about 50,000, and preferably, from typically about 1,000 to typically about 50,000. During the electropolishing cleaning process, the surfactant modifies the ratio of the metal removal rate from the seed layer in the via opening and trench opening to achieve the purpose of removing contaminant particles from the opening or openings. The surfactant additive is present in the electropolishing electrolyte solution at a concentration of typically about 14 ppm.

Figure 2:
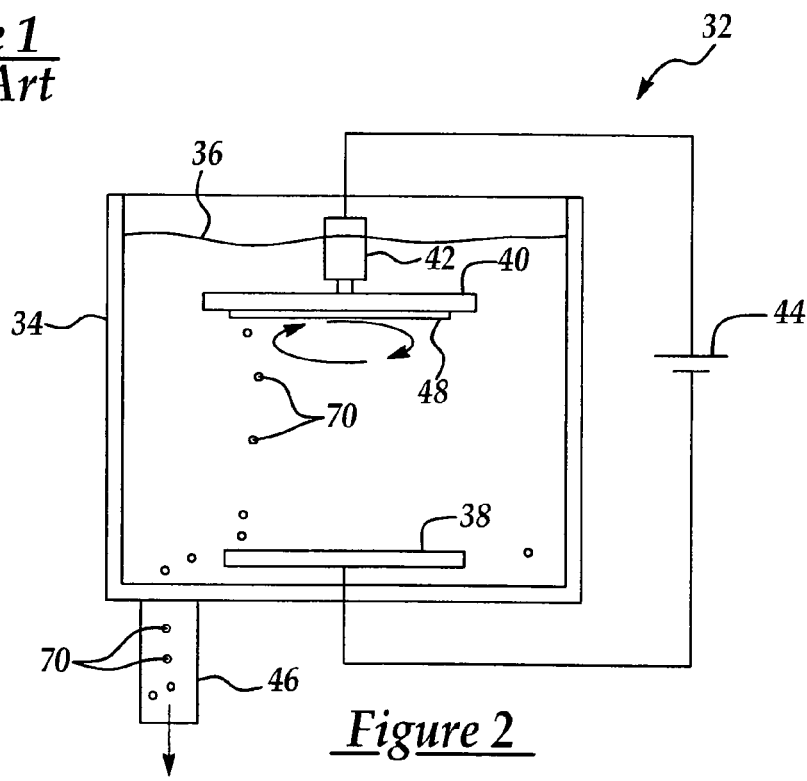
FIG. 2 is a schematic of an electropolishing apparatus in implementation of the present invention.

Referring to the schematic of FIG. 2, an electropolishing apparatus 32 in implementation of the method of the present invention includes a tank 34 which holds an electropolishing electrolyte solution 36. A metal plate electrode 38, which may be steel, for example, is immersed in the electrolyte solution 36. A wafer holder 40, which supports a wafer 48 immersed in the electrolyte solution 36, is engaged by a rotation motor 42 for rotation thereby. A voltage source 44 is electrically connected to the wafer holder 40 and the metal plate electrode 38. A particle outlet 46 may be provided in fluid communication with the tank 34 for purposes which will be hereinafter described.

Figure 3:
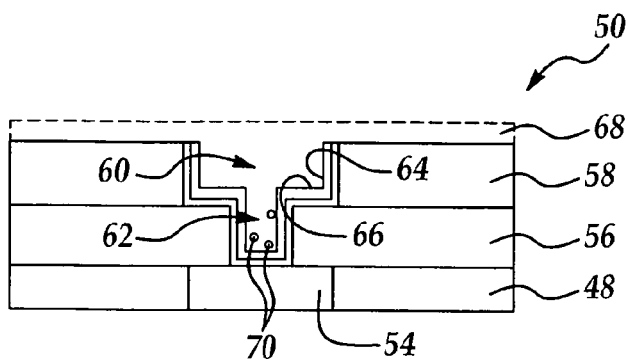
FIG. 3 is a cross-section of a dual damascene structure fabricated on a substrate according to the invention, with potential device-contaminating metal particles in the via opening following deposition of a seed layer in the trench and via openings.

Referring next to FIGS. 3, the present invention is suitable for removing metal particles 70 from a via opening 62 and/or a trench opening 60 of a dual damascene structure 50 prior to electroplated in-filling of a metal interconnect 68 in the via opening 62 and trench opening 60. The dual damascene structure 50 includes a metal line 54 which is formed in a wafer substrate 48. A bottom dielectric layer 56 is deposited on the wafer substrate 48, and a top dielectric layer 58 is deposited on the bottom dielectric layer 56.

Conventional photolithography and etching techniques may be used to form the trench opening 60 in the top dielectric layer 58 and the via opening 62 in the bottom dielectric layer 56. A metal barrier layer 64 is typically deposited on the sidewalls and bottom of the trench opening 60 and via opening 62. A metal seed layer 66, which is typically copper, is deposited on the barrier layer 64. The metal particles 70 have a tendency to fall into the via opening 62 from the environment or from the seed layer 66 into the via opening 62 and/or the trench opening 60. According to the method of the present invention, the metal particles 70 are removed from the via opening 62 and/or trench opening 60 prior to electroplating of the metal interconnect 68 in the trench opening 60 and via opening 62, as hereinafter described.

Figure 4:
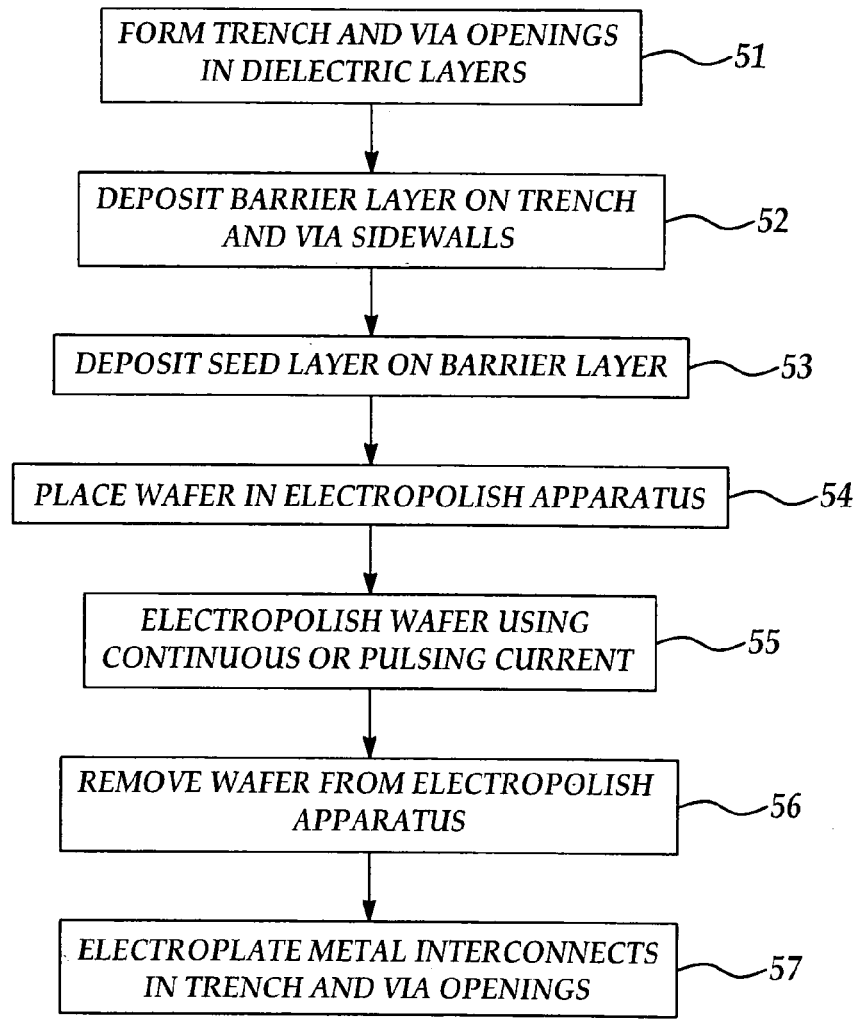
FIG. 4 is a flow diagram illustrating a typical sequence of process steps according to the method of the present invention.

Referring next to FIG. 4, in a preferred embodiment the method of the present invention is carried out in the following manner. As indicated in step S1 of FIG. 4 and as shown in FIG. 3, the trench opening 60 is formed in the top dielectric layer 58 and the via opening 62 is formed in the bottom dielectric layer 56. This is carried out typically using photolithography and etching techniques, which may be conventional.

As indicated in step S2, the barrier layer 64 is deposited on the bottom and sidewalls of the trench opening 60 and via opening 62. The barrier layer 64 may be a metal such as tantalum (Ta) or tantalum nitride (TaN), for example. The barrier layer 64 is formed using conventional chemical vapor deposition (CVD) or physical vapor deposition (PVD) techniques, for example.

Next, as indicated in step S3, the seed layer 66 is deposited on the barrier layer 64. Typically, the seed layer 66 is copper and may be formed using CVD or PVD techniques, for example. Due to the quantity of metal (>200 angstroms) removed from the seed layer 66 during the subsequent electropolishing process, a corresponding quantity of metal which exceeds the target thickness for the seed layer 66 may be added to the seed layer 66 during the deposition process. For example, if the target thickness for the seed layer 66 is 1,500 angstroms, and the anticipated quantity or thickness of metal to be removed from the seed layer 66 during the electropolishing process is 100 angstroms, then the thickness of the seed layer 66 formed on the barrier layer 64 is typically at least about 1,600 angstroms.

As indicated in step S4 and shown in FIG. 2, the wafer 48 is mounted on the wafer holder 40 of the electropolishing apparatus 32 and immersed in the electropolishing electrolyte solution 36. As indicated in step S5, the voltage source 44 then applies a pulsing electrical current or a continous electrical current to the wafer 48. Simultaneously, the wafer holder 40, by actuation of the rotation motor 42, rotates the wafer 48 at a rotational speed of typically about 30 rpm. The electrolyte solution 36 is maintained at a temperature of typically about 14 degrees C during the electropolishing process.

In a first embodiment of the invention, the voltage source 44 applies a pulsing electrical current having a pulse current density of typically about 10 mA/cm$^2$ to the wafer 48 by repeated reversal of the polarity between the wafer 48 and the metal plate electrode 38, with the wafer 48 alternately being the cathode and the anode. During the cathode phase, the wafer 48 has a negative charge. Consequently, metal cations from the electrolyte solution 36 are reduced and electroplated onto the seed layer 66 (FIG. 3). Typically, about 10 angstroms of metal is deposited on the seed layer 64 during the cathode phase.

During the anode phase, the wafer 48 has a positive charge and metal is etched from the seed layer 66 by electrolysis. Typically, about 20 angstroms of metal is removed from the seed layer 64 during the anode phase. The ratio of the quantity of metal electrolytically removed from the seed layer 66 during the anode phase to the quantity of metal electroplated onto the seed layer 66 during the cathode phase is typically about 2~5. This is accomplished by applying the pulsing electrical current to the wafer 48 for typically about 0.5 minutes.

As the pulsing electrial current is applied to the wafer 48, friction between the electrolyte solution 36 and the seed layer 66, imparted by the rotating wafer 48, causes a removal of metal from the seed layer 66. Consequently, due to the combined mechanical effects of the rotating wafer 48 and the electrolytic effects of the pulsing electrical current applied to the wafer 48, metal particles 70 are removed from the via opening 62 and/or trench opening 60 and dissolved in the electrolyte solution 36 or are drawn from the tank 34 through the particle outlet 46. Furthermore, defects are removed from the surface of the seed layer 66.

In a second embodiment of the invention, the voltage source 44 applies a continuous electrical current having a current density of typically about 10 mA/cm$^2$ to the wafer 48, in which case the wafer 48 is the positively-charged anode and the metal plate electrode 38 is the negatively-charged cathode. Accordingly, metal is etched from the seed layer 66 by electrolysis. This electrolytic effect, combined with friction imparted to the seed layer by rotation of the wafer 48 in the electrolyte solution 36, results in a loss of typically less than about 200 angstroms of metal of from the seed layer 66. Potential device-contaminating metal particles 70 are therefore removed from the via opening 62 and dissolved in the electrolyte solution 36 or removed from the tank 34 through the particle outlet 46. The continuous electrical current is applied to the wafer 48 for typically about 0.5 minutes.

Upon conclusion of the electropolishing process of step S5, rotation of the wafer 48 in the electrolyte solution 36 and application of the pulsing or continous electricalcurrent to the wafer 48 are terminated. The wafer 48 is then removed from the electrolyte solution 36 for further processing, as indicated in step S6. Finally, as indicated in step S7, the electroplated interconnects 68 are formed in the via opening 62 and trench opening 60, typically using conventional electroplating techniques.

Figure 5:
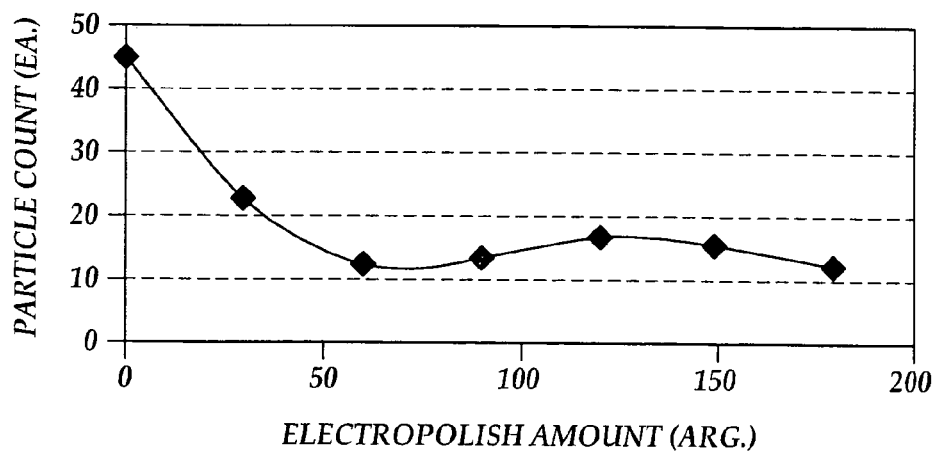
FIG. 5 is a graph wherein the number of particles (on the Y-axis) remaining in a via opening on a wafer after the method of the present invention is plotted against the thickness of material removed from a seed layer according to the method.

Referring next to the graph of FIG. 5, wherein the number of particles remaining in the via opening on a wafer (along the Y-axis) is plotted as a function of the quantity (thickness) of metal removed from the seed layer (along the X-axis) using the electropolishing method of the present invention. According to the graph, removal of about 60 angstroms of metal from the seed layer according to the method of the invention results in a particle count drop of from about 45 to about 10. This number increases slightly from about 60 angstroms to about 125 angstroms, but decreases again from 125 angstroms to 175 angstroms. Accordingly, in typical application of the invention, typically less than about 200 angstroms is removed from the seed layer to reduce the quantity of particles in the via opening and/or the trench opening.

While the preferred embodiments of the invention have been described above, it will be recognized and understood that various modifications can be made in the invention and the appended claims are intended to cover all such modifications which may fall within the spirit and scope of the invention.

What is claimed is:

1. A method for removing metal containing particles by rotational friction between the wafer and the electrolyte solution in combination with electrolysis from a wafer surface comprising damascene openings lined with a metal seed layer to thin said metal seed layer comprising the steps of:

providing an electrolyte solution comprising said metal;

immersing said wafer surface in said solution in spaced apart relation to an electrode and rotating the wafer in said solution; and simultaneously supplying a pulsed electrical current to said wafer and said electrode to result in a net removal of a portion of said metal seed layer prior to electroplating said metal to till said damascene.

2. The method of claim 1 wherein said pulsed electrical current further comprises an alternating current to alternately electroplate and remove said metal from said metal seed layer.

3. The method of claim 1 further comprising a surfactant in said solution.

4. The method of claim 3 wherein said surfactant is a surfactant selected from the group consisting of polyethylene glycol, derivatives of polyethylene glycol, polypropylene glycol, and derivatives of polypropylene glycol.

5. The method of claim 4 wherein said surfactant has a molecular weight of from about 200 to about 50,000.

6. The method of claim 1, wherein said net removal is less than about 200 Angstroms.

7. The method of claim 1, wherein said damascene openings have an opening dimension of less than about 0.2 microns.

8. The method of claim 1 wherein said metal seed layer is a copper seed layer.

9. A method for removing metal containing particles by rotational friction between the wafer and the electrolyte solution in combination with electrolysis from a metal layer on a wafer, comprising the steps of:
   providing an electrolyte solution comprising ions of said metal;
   immersing said wafer in said electrolyte solution and in spaced apart relation to an electrode and providing rotational friction between the metal layer and said solution by rotating the wafer in said solution; and
   simultaneously applying a pulsed current with alternating polarity between said metal layer and an electrode to alternately electroplate and remove, said metal and said metal containing particles from said metal layer to result in a net removal of said metal layer to form a thinned metal layer; and
   carrying out an electroplating process to form a second metal layer on said thinned metal layer.

10. The method of claim 9 further comprising a surfactant in said solution, wherein said surfactant is selected from the group consisting of polyethylene glycol, derivatives of polyethylene glycol, polypropylene glycol, and derivatives of polypropylene glycol.

11. The method of claim 9 wherein said net removal comprises metal removed from the metal layer and said metal electroplated onto the metal layer in a ratio of from about 2 to about 5 by weight of said metal.

12. The method of claim 9, wherein said metal layer is thinned by less than about 200 Angstroms.

13. The method of claim 9 wherein said metal layer is a copper seed layer lining a damascene opening.

14. A method for removing metal containing particles by rotational friction between the wafer and the electrolyte solution in combination with electrolysis from a via opening lined by a seed layer on a wafer, comprising the steps of:
   providing an electrolyte solution comprising copper sulfate, sulfuric acid, and a surfactant;
   providing rotational friction between the seed layer and said solution by rotating the wafer in said solution; and
   removing metal from the seed layer by simultaneously applying a pulsed current with alternating polarity between said seed layer and an electrode to alternately electroplate and remove metal from said seed layer to form a thinned seed layer including removing metal containing particles on said seed layer;
   then electroplating copper on said thinned seed layer to fill said via opening.

15. The method of claim 14 wherein said surfactant is selected from the group consisting of polyethylene glycol, derivatives of polyethylene glycol, polypropylene glycol, and derivatives of polypropylene glycol.

16. The method of claim 14 wherein said metal is removed from the seed layer and said metal is electroplated onto the seed layer in a ratio of from about 2 to about 5 by weight of said metal in the step of removing.

17. The method of claim 14 wherein a thickness of said metal removed from the seed layer is previously presented about 200 Angstroms.

18. The method of claim 14 wherein said via opening has an opening dimension of less than about 0.2 microns.

19. The method of claim 14 wherein said seed layer is a copper seed layer.

* * * * *